United States Patent

Ferrier et al.

[11] Patent Number: 5,289,630
[45] Date of Patent: Mar. 1, 1994

[54] PROCESS FOR FABRICATING MULTILAYER PRINTED CIRCUITS

[75] Inventors: Donald R. Ferrier, Thomaston; Donald P. Cullen, West Hartford; Edward Donlon, Bethlehem; Gary B. Larson, Cheshire; William J. Decesare, Wolcott; John L. Cordani, Waterbury, all of Conn.

[73] Assignee: MacDermid, Incorporated, Waterbury, Conn.

[21] Appl. No.: 783,974

[22] Filed: Oct. 29, 1991

Related U.S. Application Data

[63] Continuation-in-part of Ser. No. 734,247, Jul. 22, 1991, abandoned.

[51] Int. Cl.$^5$ ............................................. H05K 3/36
[52] U.S. Cl. .................................... 29/830; 156/629; 156/633; 156/659.1; 427/96
[58] Field of Search ............................ 427/96; 29/830; 156/659.1, 629, 633

[56] References Cited

U.S. PATENT DOCUMENTS

| | | | |
|---|---|---|---|
| 3,950,193 | 4/1976 | Caule | 148/31.5 |
| 4,642,161 | 2/1987 | Akahoshi et al. | 427/96 X |
| 4,775,444 | 10/1988 | Cordani | 427/97 X |
| 4,837,050 | 6/1989 | Iwasa et al. | 29/830 X |
| 4,902,556 | 2/1990 | Benedikt et al. | 156/659.1 X |
| 4,910,077 | 3/1990 | Benedikt | 29/830 |
| 4,997,516 | 3/1991 | Adler | 156/659.1 X |
| 5,076,864 | 12/1991 | Tanaka et al. | 148/269 |
| 5,106,454 | 4/1992 | Allardyce et al. | 156/629 |

FOREIGN PATENT DOCUMENTS

| | | | |
|---|---|---|---|
| 225450 | 7/1985 | Fed. Rep. of Germany | 29/830 |
| 52-68971 | 6/1977 | Japan | 29/830 |
| 2-230794 | 9/1990 | Japan | |
| 3-80595 | 4/1991 | Japan | |

OTHER PUBLICATIONS

Published Japanesse Patent Application No. 56-153797 (Hitachi; published Apr. 28, 1980) (Claim translation only).
Published Japanese Patent Application No. 58-011789 (Matsushita; published Jan. 22, 1983) (Abstract only).
Published Japanese Patent Application No. 59-25979 (Matsushita; published Feb. 10, 1984) (Claim and excerpt translation).
Published Japanese Patent Application No. 2-58898 (Toshiba; published Feb. 28, 1990) (full translation).
Published Japanese Patent Application No. 2-230794 (Matsushita; published Sep. 12, 1990) (Claim and excerpt translation).
Published Japanese Patent Application No. 2-238942 (Mitsubishi; published Sep. 21, 1990) (Abstract only).

*Primary Examiner*—Carl J. Arbes
*Attorney, Agent, or Firm*—St. Onge Stewart Johnston & Reens

[57] ABSTRACT

For attaining adhesion between copper circuitry innerlayers and pre-preg layers in a multilayer printed circuit, a conversion coating of copper oxide is provided on the metallic copper surfaces in a manner which develops an altered topography of the underlying metallic copper surfaces. Thereafter, a controlled dissolution and removal of a substantial amount of the copper oxide is effected, in a manner which does not adversely affect the already-developed topography of the underlying metallic copper, and such that the innerlayer, at the time of assembly with the pre-preg layers, has copper surfaces consisting of the topographically altered metallic copper and a relatively small amount of copper oxide thereon. Excellent bonding strengths are achieved with decreased incidence of pink ring formation as compared to conventional processes utilizing copper oxide for adhesion promotion.

4 Claims, No Drawings

PROCESS FOR FABRICATING MULTILAYER PRINTED CIRCUITS

This application is a continuation-in-part of co-pending application Ser. No. 07/734,247, filed Jul. 22, 1991, now abandoned.

BACKGROUND OF THE INENTION

The present invention relates to printed circuits, and more particularly to a process for fabricating a through-hole-containing multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto.

The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

It has long been known that the strength of the adhesive bond formed between the copper metal of the circuitry innerlayers and the cured pre-preg layers in contact therewith leaves something to be desired, with the result that the cured multilayer composite is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed in A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in U.S. Pat. Nos. 4,409,037 and 4,844,981 to Landau involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g., through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multilayer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominantly is present in distinct phases (i.e., (1) copper-from-reduction-of-copper oxide over (2) copper of the copper foil), a situation prone to separation/delamination along the phase boundary.

Thus, notwithstanding recognition in the art of the need for a structurally sound multilayer composite, and art awareness of the causes of, and problems associated with, the pink ring phenomenon, there has yet to be provided an economically feasible process which insures fabrication of multilayer printed circuits which are not prone to delamination.

SUMMARY OF THE INVENTION

The present invention provides a process for the fabrication of a multilayer printed circuit containing metallized through-holes, in which copper circuitry innerlayers are interleaved with partially-cured dielectric substrate layers so as to assemble a multilayer structure which is thereafter cured to provide a multilayer composite, and which is thereafter treated to provide metallized through-holes and other necessary features of a multilayer printed circuit.

In accordance with the invention, the circuitry innerlayers are uniquely processed before utilizing them in assembly, with pre-preg layers, of the multilayer structure. Thus, the copper surfaces of the circuitry innerlayers are first treated by conventional means to form a conversion coating of copper oxide thereon in any thickness as might conventionally be employed in the copper oxide adhesion promotion art. Thereafter, the copper oxide conversion coating is treated with a dissolution agent effective to substantially decrease the thickness of the copper oxide layer by controllably dissolving and removing the copper oxide to a sufficient extent such that—at the time when the circuitry innerlayer is arranged in contact with pre-preg layers to form the multilayer structure—copper oxide is present on the copper surfaces of the circuitry innerlayer, but in an amount which is less than that originally provided and which, in any event, is only a relatively small amount, such as an amount on the order of less than about 0.20 mg/cm$^2$, more preferably less than about 0.12 mg/cm$^2$, still more preferably less than about 0.08 mg/cm$^2$, and more preferably at or below 0.05 mg/cm$^2$. The so-processed circuitry innerlayers are then utilized in assembly of the multilayer structure, followed by curing, provision of through-holes, metallizing of through-holes, and the other conventional steps for producing a finished multilayer printed circuit.

In the process of the present invention, there is a unique coaction of effects, although not entirely understood, leading to highly advantageous results. The initial formation of what is essentially a conventional copper oxide conversion coating on the copper surfaces leads to topographic alteration of the metallic copper surface. The subsequent substantial dissolution of the copper oxide coating is carried out in a manner which essentially maintains the already-developed topography of the metallic copper surface, and which of course substantially lessens the amount of copper oxide on those topographically altered surfaces. When the multilayer structure is assembled, the innerlayer copper surfaces in contact with the pre-preg thus consist of this topographically-altered metallic copper surface and the lessened amount of copper oxide thereover. In the heat and pressure curing of the multilayer, the bonding of the innerlayer to the cured pre-preg is believed to involve, as the bonding surface of the circuitry innerlayer, this topographically-altered metallic copper surface with the further presence thereon of the lessened amount copper oxide. In the subsequent processing of the multilayer, as in the formation and metallization of through-holes, the incidence and/or extent of pink ring formation (more generally, attack of the oxide by processing media at any innerlayer area at which the oxide is exposed to the media) is decreased as compared to conventional processes utilizing copper oxide as an adhesion promoter. This result is believed to be attained because, either as a consequence of the relatively small amount of oxide present, and/or the manner in which the oxide is arrived at, and/or other factors, the oxide present tends to resist dissolution in the various processing media.

The mere decrease in the incidence or extent of pink ring formation in and of itself is not, of course, the key consideration, since this result would be readily achievable simply by use of clean copper bonding surfaces with no oxide thereon (hence nothing present to dissolve in the subsequent processing media and reveal any "underlying" pink copper metal coloration). Rather, the ultimate consideration is to attain a soundly-bonded multilayer structure at all areas of the structure, and through a bond which does not degrade in subsequent processing. Thus, decreasing "pink ring" as by utilizing untreated copper bonding surfaces is of no particular importance if the bond so achieved is not structurally sound, i.e., if it is at the expense of the ultimately desired goal.

The key importance, then, of the present invention is that a soundly bonded multilayer structure is attained in a manner which does not make primary reliance on an oxide which would be prone to subsequent dissolution in through-hole processing media, as in conventional technology. Rather, the innerlayer bonding surface is a topographically-altered metallic copper surface having only a relatively small amount of copper oxide thereon, and results in a very sound bond. At all areas of the structure where there is no opportunity for processing media to dissolve this small amount of copper oxide, the attained bond is of course retained to its high degree. At those areas (e.g., edges, through-hole surfaces) where subsequent processing media can potentially gain direct access to the surfaces, it would appear that, for reasons not entirely understood, this relatively small amount of copper oxide tends to resist dissolution by the processing media, and hence no significant adverse alteration of the initially attained bond strength occurs.

Thus, the present invention provides a means for eliminating the localized delamination which can occur at through-hole locations in processes employing conventionally formed copper oxide layers as an adhesion promoter for innerlayer circuits, but without at the same time compromising on the strength, at all areas of the circuit, of the lamination bonding itself.

As elaborated upon hereinafter, and as set forth in the claims, the present invention provides an improvement in the fabrication of multilayer printed circuits. Thus, in a process for fabricating a multilayer printed circuit, in which: a multilayer structure is assembled as an alternating array of one or more copper circuitry innerlayers and one or more layers of partially-cured dielectric substrate material; the multilayer structure is then subjected to heat and pressure to cure the structure into an integral multilayer composite in which copper surfaces of the innerlayer circuitry layers are bonded to the now-cured dielectric substrate material in contact therewith; and the multilayer composite is then provided with one or more through-holes which are thereafter metallized; the improvement is characterized in that the copper surfaces of the circuitry innerlayers, prior to assembly in the multilayer structure, are processed to form thereon a conversion coating of copper oxide, with the result of topographically altering the underlying metallic copper surface; following which the copper oxide coating is treated with a dissolution agent effective to controllably dissolve and remove the so-formed copper oxide, without significant alteration of the earlier generated topography of the underlying metallic copper surfaces, the dissolution and removal being to a sufficient extent such that, when the circuitry innerlayer is arranged in contact with the partially-cured dielectric substrate material, copper oxide exists on the copper surfaces but in an amount which is decreased from that originally present and which, in any event, is a relatively small amount, e.g., an amount no greater than about 0.20 mg/cm$^2$; and following which the so-processed innerlayers are utilized in assembly of the multilayer structure.

The dissolution agent used for controllably dissolving and removing the requisite amount of the initially formed copper oxide conversion coating can be selected from a number of useful solutions having the capability of effecting the controlled dissolution without adversely affecting the overall topography attained as a result of the copper oxide formation, including dilute solutions of mineral acids such as sulfuric acid; solutions of weak acids, such as organic acids or their salts, including substituted or unsubstituted monocarboxylic acids, dicarboxylic acids and tricarboxylic acids; and solutions of species capable of dissolving copper ions through complexation.

DETAILED DESCRIPTION OF THE INVENTION

The generalized procedures for fabricating a multilayer printed circuit are quite well known in the art. The circuitry innerlayers of a multilayer circuit are generally patterned in a desired circuitry configuration, although use also can be made of one or more innerlayers which are essentially continuous metal layers for use, e.g., as ground or power planes or the like. For patterned circuitry innerlayers, each is itself a printed circuit, consisting of copper circuitry on one or both sides of an insulating substrate material. In the typical fabrication of a patterned circuitry innerlayer, the starting material is a copper foil-clad dielectric substrate material, which can be any suitable thermosetting or thermoplastic resinous material such as epoxy, polyimide, polyester, phenolic, polyethylene, fluorocarbon polymer, co-polymers thereof, and the like, generally with inorganic material reinforcement such as glass fibers or the like.

For patterned circuitry innerlayers, the pattern is arrived at, on one or both sides of the substrate, by conventional techniques whereby an etch-resistant material is arranged on the copper foil surface in the positive of the pattern of eventually desired circuitry. The resist, generally an organic resinous material, can be arranged in the desired pattern by any number of means, but the predominantly employed process is through use of a photoresist layer which is then imagewise exposed and developed to leave the desired resist pattern. Thereafter, the innerlayer is subjected to the action of a copper etchant, whereby all exposed copper (i.e., that not protected by the resist) is etched away down to the substrate surface. When the resist is thereafter removed, the innerlayer surface then has copper foil in the desired circuitry pattern.

In accordance with the present invention, as described in further detail hereinafter, the copper foil circuitry pattern so-provided would then be processed to form on its surfaces, and then controllably dissolve away a substantial portion of, a copper oxide conversion coating, before utilizing the innerlayer in assembly of the multilayer circuit.

It is not strictly necessary that the copper circuitry of patterned circuitry innerlayers consist of the copper foil of the original copper foil cladding. It is also possible, for example, to additively produce the circuitry of the innerlayers, such as by starting with a bare substrate material, patterning a plating resist thereon in the negative of the circuitry pattern, and then electrolessly depositing copper on those areas not covered by the resist. Another variation is to employ a combination of additive and subtractive processes in forming the innerlayer circuitry. This variation is particularly useful in providing innerlayer circuitry having a substantial thickness of copper, and even more particularly useful in fabricating a multilayer printed circuit having buried through-holes, i.e., through-holes (or "vias") conductively interconnecting particular layers of innerlayer circuitry but not common to the through-holes later formed through the entirety of the multilayer composite. In this latter regard, a double-sided copper foil-clad substrate has through-holes drilled therein which are then metallized via electroless copper depositing (at the same time providing electroless copper over the copper foil cladding). Typically the electroless copper surface will then be patterned with a plating resist in the negative of the desired pattern of circuitry and the exposed areas then further built up with metal by electroless or electrolytic methods. The built up areas are then protected by an etch resist, the plating resist removed, the electroless copper and copper foil thereunder then etched away down to the substrate surface, and the etch resist then removed to provide the desired pattern of built up copper circuitry and plated through holes. The circuitry innerlayer so produced is then processed according to the invention for use thereafter in assembly of the multilayer structure.

As such, the inventive formation, followed by controlled dissolution, of a copper oxide conversion coating, can be employed on a copper surface consisting of copper foil or electroless copper or electrolytic copper depending upon how the innerlayer circuit was produced. Also, when reference is made herein to "copper", it should be understood that the term embraces not only substantially pure copper but also suitable copper alloys or intermetallics useful in printed circuitry.

Once the circuitry innerlayer is formed, and irrespective of whether its outer-facing metallic copper circuitry surface is copper foil or electroless or electrolytic copper, the method of the present invention is then employed to further prepare the innerlayer for use in assembly of the multilayer laminate.

The first step in this process is to form on the metallic copper surfaces a copper oxide conversion coating.

It is possible to provide the requisite copper oxide coating by any number of means (including controlled air oxidation), but by far the most preferred route is by surface oxidation using a copper oxidizing solution. As previously noted, there are a great many known solutions and processes for providing this copper oxide conversion coating, with the very substantial majority being based upon combination of alkali metal or alkaline metal chlorite and alkali metal hydroxide in a variety of concentrations and for use in a variety of processing conditions. See, e.g., Landau, U.S. Pat. Nos. 4,409,037 and 4,844,981, and the references cited therein, such as U.S. Pat. Nos. 2,364,993; 2,460,896; 2,460,898; 2,481,854; 2,955,974; 3,177,103; 3,198,672; 3,240,662; 3,374,129; and 3,481,777, as well as U.S. Pat. No. 4,512,818, all of which are expressly incorporated herein by reference. The art variously refers to such solutions and processes in terms of the color and/or thickness of the copper oxide layer so-produced, e.g., thick black oxide, thin black oxide, brown oxide, bronze oxide, red oxide, and the like.

It is appropriate to again note here that the bonding surface of the circuitry innerlayer according to the present invention is not copper oxide per se, but rather is believed to involve the underlying metallic copper surfaces—whose topography has been altered by the controlled formation thereon of the copper oxide conversion coating followed by substantial dissolution of the so-formed oxide therefrom in a manner which does not adversely affect the desirably attained topography—aided by the small amount of copper oxide which is arranged to be present on these metallic copper surfaces at the time of innerlayer and pre-preg assembly into a multilayer structure. In the art, the choice of any particular means for forming a particular oxide has primary reference to the capability of the so-formed oxide itself to promote suitable adhesion of the circuitry innerlayer to the cured pre-preg dielectric substrate layer in contact therewith. As such, the oxide choice and the necessary thickness thereof may vary depending upon the type of dielectric material used as pre-preg layers (e.g., epoxy, polyimide, etc.), and other factors, and can be somewhat limited. In contrast, the earlier-noted bonding mechanism involved in the present invention is such as to permit considerably wider latitude in the particular copper oxide, processes and thicknesses suitable for the initial step of copper oxide formation. Thus, rather than having reference to adhesion promotion capability of the oxide per se, the choice of any particular oxide and process is based upon the functional requirements that in formation of the oxide there is achieved a suitable topographic alteration of the metallic copper surface, and that the oxide is one capable of controlled removal under conditions which will not adversely affect the so-generated metallic copper surface topography, such that the metallic copper surface, with a small amount of copper oxide thereon, enters into a suitably sound bond with pre-preg layers in contact therewith upon assembly and curing of the multilayer structure.

The most preferred solutions and processes among this wide choice are solutions based upon sodium or potassium chlorite and sodium or potassium hydroxide, and using processes (immersion or spraying) involving temperatures preferably less than about 200° F., more preferably less than about 160° F. Within these ranges, and depending upon the particular concentrations and conditions, there can be produced copper oxide conversion coatings on the metallic copper circuitry surfaces of a variety of thicknesses, colors and compositions. Generally speaking, the thickness of the copper oxide conversion coating to be attained is functionally dictated by that which results from the extent of treatment needed to obtain the desired topography of the underlying metallic copper, and in general is essentially that known in the art to be useful in conventional situations wherein copper oxide is to be utilized as the primary promoter of adherent bonding. As a general matter, the copper oxide conversion coating will typically provide a coating thickness of at least about 0.05 mg/cm$^2$, and generally between about 0.05 and 0.6 mg/cm$^2$.

For forming the oxide coating, the metallic copper circuitry surface typically will first be cleaned to remove contaminants therefrom, including a microetching of the surface such as with a peroxide/sulfuric acid etching solution.

Following the formation of the copper oxide conversion coating on the metallic copper surfaces of the circuitry innerlayer, the formed oxide is then deliberately and controllably dissolved to the requisite extent by direct dissolution in a suitable dissolution agent. It is to be kept in mind that this step is essential no matter what the initial amount of copper oxide, i.e., whatever amount is provided in the initial copper oxide formation step, there must follow the controlled dissolution step which decreases that initially formed amount.

In the dissolution of the previously formed copper oxide conversion coating, the primary functional requirements are that the dissolution be conducted in a manner which does not substantially adversely affect the desirable copper surface topography attained in the copper oxide formation step, and that the dissolution be carried out to an extent such that, with reference to the time when the circuitry innerlayer is arranged in contact with the pre-preg layer for forming the multilayer assembly, copper oxide exists on the metallic copper surfaces but only in a relatively very thin layer, e.g., in an amount on the order of less than about 0.20 mg/cm$^2$, and, in any event, an amount less than that initially provided.

Given these requirements, it is found that the preferred dissolution agents are those which exhibit the capability of dissolving copper oxide, but which are not so aggressive in this regard (by their nature per se or the conditions at which they must be employed) as to preclude the ability in practice to control the dissolution to whatever extent desired. Yet further, the dissolution agent must be one which is functional to achieve this controllable dissolution in a manner which does not at the same time bring about any substantial loss of the topography already attained in the underlying metallic copper surface.

In these regards, the preferred dissolution agents will include dilute aqueous solutions of otherwise strong mineral acids, such as dilute solutions of sulfuric acid, and solutions of inherently weak acids (or salts thereof), typically organic acids such as monocarboxylic acids (e.g., acetic acid, propionic acid, acrylic acid), dicarboxylic acids (particularly those having an odd number of carbon atoms in the backbone) (e.g., malonic acid, glutaric acid), and tricarboxylic acids (e.g., citric acid), whether unsubstituted or substituted with halo-, amino-, hydroxyl- or methylene- or other like groups (e.g., trichloracetic acid, glycine, malic acid, tartaric acid, glycolic acid, itaconic acid). Also useful are species which effect dissolution through complexation with ionic copper, including nonionic species such as substituted hydroxyalkyl alkyl amines (e.g., tetra (2-hydroxypropyl) ethylenediamine); ionic species such as alkyl carboxylic acid alkyl amines (e.g., ethylenediamine tetraacetic acid, hydroxyethyl ethylenediamine triaacetic acid); and salts and mixtures of the foregoing species.

The particular conditions and time of contact of the copper oxide conversion coating with the dissolution agent will, of course, vary depending upon the particular dissolution agent employed and the extent of copper oxide dissolution necessary. Conditions suitable for particular agents are illustrated in the Examples presented hereinafter.

As earlier noted, the dissolution procedure is carried out for a time effective to controllably remove sufficient copper oxide such that, with reference to the time when the circuitry innerlayer is arranged in contact with a pre-preg layer in assembling the multilayer structure, copper oxide exists on the copper surfaces of the circuitry innerlayer but in an amount which is less than that initially provided, and which in absolute terms is a relatively small amount. Preferably, this small amount of copper oxide is no greater than about 0.20 mg/cm$^2$; more preferably, the amount is no greater than about 0.12 mg/cm$^2$; yet more preferably, the amount is no greater than about 0.08 mg/cm$^2$; and still more preferably, an amount no greater than about 0.05 mg/cm$^2$.

In the most preferred embodiment of the invention, the dissolution process will be suitably controlled so as to leave behind on the metallic copper surfaces a thin layer of the earlier-formed copper oxide, in the mg/cm$^2$ amounts earlier described. It is also found, however, that the aims of the invention are substantially attained if in fact the dissolution process effects removal of essentially all the originally-formed copper oxide, inasmuch as the eventually required presence of a small amount of copper oxide on the metallic copper surfaces of the circuitry innerlayer at the time when the innerlayer is arranged in contact with a pre-preg layer can be arranged to form on the copper surfaces as a result of air oxidation and baking steps in the interim between the dissolution procedure and the assembly of the multilayer structure. This so-formed oxide, in similar manner to the situation where the oxide is present as the remains, after the dissolution step, of the initially-formed copper oxide conversion coating, serves to aid in the bonding of the topographically altered copper surface to the pre-preg layer, and yet, either by reason of its small amount and/or the manner in which it is obtained, or other factors, exhibits decreased tendency, as compared to conventional oxide processes, for the local dissolution/delamination situation in subsequent through-hole processing.

With the innerlayers processed according to the invention, there is then assembled the multilayer structure. In the assembly, an alternating arrangement of circuitry innerlayer, one or more pre-preg layers, circuitry innerlayer, one or more pre-preg layers, etc. is provided in whatever number and sequence appropriate for the eventually desired multilayer circuit. Indeed, as the number of innerlayers increases so too does the advantage of the present invention, inasmuch as the number of areas for possible delamination also correspondingly increases. The dielectric material used for the pre-preg layers can be any suitable heat and pressure curable resin, and typically the pre-preg will consist of a reinforcing material (e.g., glass cloth) impregnated with the curable resin (epoxy, polyimide, or the like).

The multilayer structure is converted to an integral cured and bonded composite by subjecting it to heat and pressure for an appropriate time. Typical laminating conditions are pressures in the range of 300 to about 400 psi, at a temperature of about 150° C. to about 205° C., for a time of from about 1 to 4 hours. Following lamination, there often will be a post-baking of the laminate (e.g., at about 150° C.).

In the further processing of the multilayer composite to form a multilayer printed circuit, a number of through-holes will be drilled through the composite and the through-holes then metallized.

The processes for metallizing through-holes of multilayer printed circuits are well known in the art and do not require extensive discussion. Typically, the through-hole surfaces will first be desmeared to remove resin smear from the innerlayer edges exposed at the through-hole (e.g., via sulfuric acid, plasma desmearing, alkaline permanganate, etc.), and may still be further treated to prepare the through-hole surfaces for full and adherent receipt of electroless metal, such as by post-desmear processing, etch-back, or the like. The surfaces of the through-hole are then further prepared for metallization through use of conditioning and catalyzing steps, followed by metallization using an electroless copper plating bath.

A complete description of through-hole metallization processes, and particular steps and compositions for use therein, can be found in a variety of patents and publications. Useful reference can be had to Kukanskis et al, published PCT application WO 89/10431, and the references cited therein, all incorporated herein by reference.

In the course of the through-hole metallization process, the outerlayers of the multilayer composite will also be processed to provide circuitry patterns thereon. For example, the electroless metallization of the through-holes also provides electroless metal over the outerlayer surfaces. The surfaces can then be patterned with plating resist in the negative of the ultimately desired circuitry, followed by build up of the exposed copper areas (including through-holes) with additional electroless or electrolytic copper. The built up areas are then protected by an etch resistant material (e.g., electroplated tin-lead or organic resin), the plating resist removed, and the copper previously thereunder then etched away down to the substrate surface. Thereafter, the multilayer printed circuit can be further processed as necessary, and as well known in the art, to solder mask particular portions, preserve solderability of other portions, etc.

By virtue of the present invention, strong adherence between circuitry innerlayers and cured pre-preg layers is obtained. As such, one advantage is in the bonded strength of the overall laminate, such that it is resistant to delamination which might otherwise be caused by the stresses of hole drilling and other severe processing steps, as well as in conditions of use. Another significant advantage is that since the copper surface of the circuitry innerlayer contains only a small, yet importantly present, amount of copper oxide, and perhaps also by reason of the manner in which obtained, the surface exhibits a decreased level of chemical alteration during through-hole metallization and other subsequent processing, as compared with conventional copper oxide promoted adhesion employing relatively large amounts of directly formed copper oxide. Thus, the often stringent conditions of such processing does not lead to any significant localized chemical change in the bonded surfaces and resultant localized delamination. Of particular importance is that the foregoing result is obtained without counter-productive compromise of the adhesion per se of the entire multilayer circuit.

The invention is further described and illustrated with reference to the following examples.

EXAMPLE I

An epoxy-glass laminate clad on both sides with copper foil, and a correspondingly-sized piece of 2 oz. copper foil, were both subjected (after scrubbing of the laminate) to the following process steps to produce on their copper surfaces a substantially uniform copper oxide conversion coating having a thickness of about 0.5 mg/cm$^2$:

(a) cleaning in a commercial cleaner (OmniClean CI; MacDermid, Inc., Waterbury, Conn.) for 5 minutes at 150° F.;

(b) water rinse;

(c) microetching in an ammonia-free commercial microetchant solution (Microetch G-4, one pound per gallon; MacDermid, Inc.) at 90° F. for 3 minutes;

(d) water rinse;

(e) immersion in 10% sulfuric acid (room temperature) for 2 minutes;

(f) water rinsing;

(g) immersion in a commercial conversion oxide-forming solution containing sodium chlorite and sodium hydroxide (MaCuBlack LT 9281, 100% activity in caustic; MacDermid, Inc.) for 5 minutes at 160° F.;

(h) water rinsing;

(i) water rinsing.

The laminate and foil were then each immersed in 0.5% sulfuric acid at room temperature for one minute to effect substantial dissolution of the copper oxide conversion coating, followed by rinsing and drying. The foil surfaces at this stage had a slightly non-uniform matte dark pink appearance.

The laminate and foil each were baked at 135° C. for 30 minutes. The so-processed copper clad laminate and copper foil, having less than about 0.2 mg/cm$^2$ copper oxide on their copper surfaces, were then sandwiched about a suitably-sized B-stage pre-preg layer (glass cloth impregnated with epoxy resin) and the composite then laminated at 350–400 psi and 160° C. for one hour. After patterning and alkaline etching of the outer-facing copper foil piece to provide a circuitry pattern, the adhesion of the copper foil to the cured B-stage pre-preg in the multilayer composite was tested and found to be about 6.5 to 7.0 lbs/inch.

A sample of this multilayer composite was immersed in 10% hydrochloric acid at 110° F. for 30 minutes, and no evidence was seen of attack by the acid between the copper foil and cured B-stage at the edges of the sample. In addition, a sample of the multilayer composite was drilled to provide a number of through-holes therein, and the through-holes were metallized in a process utilizing sulfuric acid etchback, solvent swelling, alkaline permanganate desmear, glass etching, through-hole conditioner, electroless copper catalytic activation, electroless copper plating (20 microinches) and over-plating of electrolytic acid copper (2 hours at 15 ASF). Following the metallization, no evidence was seen of attack of the copper foil/cured B-stage interface, nor of localized delamination at or near through-hole surfaces.

EXAMPLE II

Comparison

Example I was identically repeated with the exception that the immersion of laminate and foil in the 0.5% sulfuric acid solution after formation of the copper oxide conversion coating was eliminated. The adhesion of the copper foil to the cured B-stage pre-preg in the multilayer composite was only about 3 lbs/inch. The immersion of a sample of the multilayer composite in 10% hydrochloric acid produced attack on the oxide for a depth of 15 mils from the sample edge. For the metallized through-hole sample, pink rings extending 4 mils beyond the hole perimeter were observed.

EXAMPLE III

Example I was identically repeated with the exception that the immersion of the laminate and foil in the 0.5% sulfuric acid solution after formation of the copper oxide conversion coating was replaced by immersion for 5 minutes at 150° F. in a 30 g/l solution of malonic acid, adjusted to pH 2.5 with sodium hydroxide, resulting in a uniform, matte, dark pink appearance on foil surfaces. The adhesion between foil and cured B-stage pre-preg in the multilayer composite was about 7 lbs/inch, and the same results as in Example I were achieved upon immersion in 10% hydrochloric acid and upon through-hole metallization.

EXAMPLE IV

Comparison

Example I was identically repeated with the exception that the immersion of the laminate and foil in the 0.5% sulfuric acid solution after formation of the copper oxide conversion coating was replaced by immersion in 0.18N phosphoric acid. The adhesion between foil and cured pre-preg in the multilayer composite was only 1.2 lbs/inch, and treatment of a sample with the 10% hydrochloric acid resulted in attack of the foil/cured pre-preg interface to a depth of about one mil.

EXAMPLE V

Comparison

Example I was identically repeated with the exception that the immersion of the laminate and foil in the 0.5% sulfuric acid solution after formation of the copper oxide conversion coating was replaced by immersion in 10% sulfuric acid. The foil surfaces had a red-pink appearance, and the adhesion between foil and cured pre-preg in the multilayer composite was only 3.2 lbs/inch.

EXAMPLE VI

Example I was repeated with the exception that the copper oxide forming treatment of step (g) utilized a different commercial formulation, though similarly containing alkali metal chlorite and alkali metal hydroxide (OmniBond Oxide, brown formulation; MacDermid, Inc.), and with the further exception that the immersion of the laminate and foil in the 0.5% sulfuric acid solution after formation of the copper oxide conversion coating was replaced by immersion for 5 minutes at 140° F. in 0.18M citric acid (adjusted to pH 4.0 with dilute sodium hydroxide). The adhesion between foil and cured pre-preg in the multilayer composite was about 6-7 lbs/inch, and no attack was evident in the 10% hydrochloric acid treatment test.

EXAMPLE VII

Comparison

Example VI was identically repeated but with elimination of the citric acid treatment. Adhesion values of 13-14 lbs/inch were obtained, but treatment in the 10% hydrochloric acid resulted in attack of the oxide to depths ranging from 2 to 10 mils from the sample edges.

EXAMPLE VIII

Example I was identically repeated with the exception that the copper oxide forming treatment of step (g) utilized a different commercial formulation, though similarly containing alkali metal chlorite and alkali metal hydroxide (OmniBond Oxide, thick black formulation; MacDermid, Inc.) to produce an oxide layer of 0.58 mg/cm$^2$, and with the further exception that the immersion of the laminate and foil in the 0.5% sulfuric acid solution after formation of the copper oxide coating was replaced by immersion for 5 minutes at 120° F. in a 50 g/l solution of malic acid (pH 1.9), producing on the foils a uniform brown surface (about 0.05 mg/cm$^2$ oxide). The adhesion between foil and cured pre-preg in the multilayer composite was 10.5 lbs/inch, and no evidence of attack in the 10% hydrochloric acid treatment test, or following through-hole metallizing, was apparent.

The foregoing Examples demonstrate the unique features and required cooperating interactions involved in the present invention.

Fundamentally, the first requirement is that the copper surfaces of the circuitry innerlayers be provided with a conversion coating of copper oxide. The copper oxide coating is not in and of itself relied upon as the primary bonding surface for innerlayer/pre-preg bonding as in conventional processes, but instead is necessary as a means to an end, i.e., its formation promotes the development in the underlying metallic copper surface of a topography which enables the copper to adherently bond to a cured pre-preg layer.

Given this consideration, another required element of the invention is the deliberate removal of a significant portion of the so-formed oxide, thus substantially revealing the underlying topographically desirable bonding surface and, importantly, serving to substantially decrease the oxide dissolution which otherwise would occur in subsequent processing of the multilayer composite and the consequent localized delamination tendency caused by this dissolution of a primary bonding surface.

As the Examples also demonstrate, this dissolution of the initially formed oxide is not simply a matter of just getting rid of most of the oxide; instead, the process must be carried out in a controlled manner which does not adversely alter the underlying topography already in place.

In terms of the requisite extent of oxide removal, the criteria are essentially functional. At a minimum, of course, it is necessary to remove at least an amount sufficient to decrease the importance of oxide as a bonding surface for the pre-preg, since otherwise the localized oxide dissolution which later would occur in through-hole processing will run the risk of producing localized delamination. It is for this reason that the present invention seeks to provide a copper surface, at the time of innerlayer/pre-preg assembly, having no greater than specified amounts of copper oxide thereon. Nevertheless, it presently appears necessary that, however small, some amount of copper oxide must be present on the copper surface at the time of innerlayer/pre-preg assembly, whether by its remainder after the dissolution step or its re-formation in air after complete removal in the dissolution step. Still further, the amount provided must have been arrived at by the initial formation of copper oxide, followed by controlled dissolution, no matter how little oxide per se might be present after initial formation, i.e., even if it was initially provided in an amount already at or below the amounts heretofore discussed (e.g., no more than about 0.20 mg/cm$^2$, etc.) with reference to the oxide present at the time of lamination of innerlayer and pre-preg.

In connection with the present invention, a unique process also has been discovered for effecting the treatment of the copper oxide-coated copper surfaces with the dissolution agent for controllable dissolution and removal of copper oxide. The process is particularly suitable for those commercial scale operations in which a significant quantity of innerlayers is processed.

As previously noted, the preferred method for carrying out the invention is by immersion of the innerlayers, whose copper surfaces have a conversion coating of copper oxide thereon, in a dissolution agent for a time and at conditions which will effect the requisite degree of controllable dissolution and removal of the copper oxide. For commercial operations, it is most preferred that the requisite degree of such dissolution/removal be arranged to be a function simply of immersion contact time. In other words, the most desirable and simple form of process control is the pre-establishing, for a given type and thickness of copper oxide coating, a given dissolution agent, and a given operating temperature, of a set immersion time (or narrow range thereof) which essentially invariably produces the requisite extent of oxide dissolution. The problem arises, however, that process control in this manner is highly complex in this process because the dissolution agent becomes progressively more laden with copper ions and thus becomes progressively less efficient in copper oxide dissolution. Thus, as immersion processing progresses, any pre-determined immersion time for achieving the requisite degree of oxide dissolution based upon, e.g., a freshly made-up solution of dissolution agent, will be found over time not to be effective in attaining the desired degree of dissolution. While it may be possible to alleviate this problem with frequent replacement of dissolution agent with freshly made-up solutions thereof, processing in this manner is economically disadvantageous.

According to the invention, the immersion contact of the copper oxide-coated innerlayers with dissolution agent is carried out in a process in which the dissolution agent is substantially continuously circulated from the innerlayer contact zone (e.g., immersion vessel or portion thereof), into contact with an ion exchange resin, and then returned to the innerlayer contact zone. The ion exchange resin, which typically is housed in a cylindrical or other suitably-shaped cartridge, will be composed of any suitable ion exchange resin effective to remove copper ions from the particular dissolution agent solution by ion exchange mechanism, thereby simultaneously regenerating the dissolution agent solution to its initial form. Given the acidic nature of the most preferred dissolution agent solutions utilized in accordance with the present invention, the preferred ion exchange resin will be a cation exchange resin, particularly of the strong acid type such as is the case for sulfonated resins. Thus a typical and preferred resin will comprise a suitable resin foundation, such as polystyrene cross-linked with divinyl benzene, which is then sulfonated to provide —$SO_3H$ groups for effecting the ion exchange function. Although less preferred, utilization of weak acid forms of cation exchange resins, such as those based upon pendant —COOH groups, also is possible for certain dissolution agent solutions. In either case, of course, the particular resin is chosen on the basis of the particular nature of the dissolution agent to be processed thereby, i.e., such that the pendant exchange groups of the resin will be sufficiently dissociated in the environment of the solution being treated such that exchange of hydrogen ion for copper ion in the dissolution agent solution is brought about.

As is well known in the art, ion exchange resins are available in a wide variety of bead sizes and porosity, and can be arranged to provide a wide range of volumetric capacities. For any given type of dissolution agent solution in question, and known or expected copper ion concentration therein after processing of innerlayers according to the invention, and for any given throughput of dissolution agent solution desired for the overall process, it is well within the skill of the art to select an exchange resin of suitable physical properties for achieving the required degree of removal of copper ions from the dissolution agent solution such that overall process control based upon contact time of innerlayers with dissolution agent is possible. While it is possible to operate, and establish times for, the overall immersion process using dissolution agents of any particular and substantially constant concentration of copper ions, it is of course preferred that the dissolution of oxide be effected with a dissolution agent having the lowest possible copper ion concentration so as to attain the most efficient and rapid dissolution possible. As such, the resin type, volume and volumetric throughput will preferably be chosen such that the concentration of copper ion in the dissolution agent after passage through the ion exchange resin will be on the order of less than about 0.5 g/l and most preferably less than about 0.1 g/l. With substantially continuous recirculation and ion exchange treatment, such concentrations can be substantially constantly maintained throughout innerlayer processing.

As the ion exchange resin itself becomes laden with copper ion, it can be regenerated to elute the copper ions therefrom and restore the resin to its original form for further ion exchange. As an additional benefit, copper values are recovered in an efficient and cost-effective manner.

The foregoing process is illustrated in the following example.

EXAMPLE IX

A series of panels of copper-clad epoxy-glass laminate were identically treated to provide on the copper surfaces a thick black oxide conversion coating. A bath was prepared containing 50 g/l of malic acid (pH about 1.9) at about 120° F. for effecting controlled dissolution and removal of copper oxide from the panel surfaces, while substantially maintaining the topography of the copper surfaces, to an extent such that the panel surfaces would have approximately 0.05 mg/cm,$^2$ of oxide thereon at the conclusion of the treatment.

For effecting the dissolution, the bath (total volume, 13 gallons) was continuously circulated from the immersion processing tank, to and through an ion exchange cartridge, and returned to the processing tank, at a rate of about 10 liters per minute. The ion exchange cartridge housed approximately 0.6 cubic feet of a cation exchange resin in strong acid form, consisting of polystyrene cross-linked with divinyl benzene and sulfonated to provide —$SO_3H$ groups (Sybron Ionac C-267 ion exchange resin; available from Sybron Chemicals, Inc., Birmingham, N.J.).

Copper oxide-coated panels were immersed in the bath for 5 minutes, and the processing of panels continued until about 1580 square feet of copper surface had been processed by the bath. Periodic sampling of the bath indicated a relatively constant copper concentration therein of less than about 0.2 g/l over the course of processing, and a relatively constant pH of about 1.8 to 2.0. At the end of the processing run, it was determined that the malic acid concentration of the bath declined by only about 11%. All panels processed through the bath were substantially uniform in appearance and properties (peel strength, delamination). In lamination tests, involving immersion of the laminate in 10% hydrochloric acid, only minimal evidence of pink ring was noted (<1 mil), as compared to a 5 mil pink ring found when employing panels which had not been subjected to the malic acid treatment, and excellent adhesion values were obtained.

The ion exchange resin utilized in the foregoing process was regenerated by thoroughly rinsing the resin with clean deionized water, followed by sequentially flowing four 5-gallon batches of 10–20% sulfuric acid through the resin (30 minute contact time for each batch), thus eluting copper ion from the resin in the form of copper sulfate while at the same time returning the resin to its acid (hydrogen ion) form. Associated filter and pump devices were then thoroughly rinsed with deionized water until all rinse water tested negative for sulfate ion (absence of precipitate with barium ion). The regeneration recovered 505 grams of copper, as compared to an estimated 589 grams of copper dissolved by the malic acid bath during the processing run, for a recovery yield of about 85%. The regenerated resin was utilized again in the foregoing process sequence, with no difference in results.

It will be appreciated by those of skill in the art that the foregoing description and examples have been employed in illustration of particular features of the invention, and it is to be understood that specific compounds, amounts, process conditions, and the like are not intended as limitations upon the invention except as set forth in the appended claims.

What is claimed is:

1. In a method for manufacturing a multilayer printed circuit having metallized through-holes, wherein (a) a multilayer structure is assembled as an alternating array of one or more copper circuitry innerlayers and one or more layers of partially-cured dielectric substrate material; (b) the multilayer structure is thereafter subjected to heat and pressure to cure the structure into an integral multilayer composite in which copper surfaces of said copper circuitry innerlayer are bonded to the now-cured dielectric substrate material in contact therewith; and (c) the multilayer composite is thereafter provided with one or more through-holes which are thereafter metallized; the improvement comprising the steps of (i) treating the copper surfaces of said copper circuitry innerlayer, prior to its use in assembly of said multilayer structure, to form thereon a conversion coating of copper oxide; (ii) thereafter subjecting said copper surfaces having said conversion coating of copper oxide thereon to the action of a dissolution agent effective to controllably dissolve and remove at least a portion of said copper oxide form said copper surfaces; and (iii) thereafter utilizing said copper circuitry innerlayer in assembly of said multilayer structure, and wherein said subjecting of said copper surfaces having said conversion coating of copper oxide thereon to the action of a dissolution agent according to step (ii) comprises providing a vessel containing said dissolution agent; immersing in said dissolution agent in said vessel the circuitry innerlayer having said conversion coating of copper oxide on its copper surfaces, for a time effective to controllably dissolve and remove said conversion coating of copper oxide from said copper surfaces according to step (ii); and substantially continuously recirculating said dissolution agent from said vessel to and through an ion exchange resin effective to substantially remove copper ions from said dissolution agent, and returning the so-treated dissolution agent to said vessel.

2. A method according to claim 1 further comprising the step of periodically regenerating said ion exchange resin to recover copper therefrom.

3. In a method for treating a copper circuitry innerlayer prior to utilizing said innerlayer in assembly, with one or more partially-cured dielectric substrate material layers, of a multilayer structure for a multilayer printed circuit, in which the copper surfaces of said circuitry innerlayer are initially provided with a conversion coating of copper oxide thereon to serve as an adhesion promoter, the improvement comprising:

(a) immersing said innerlayer having said conversion coating of copper oxide on its surfaces in contact with a dissolution agent, housed in a treatment vessel, effective to controllably dissolve and remove said copper oxide coating to an extent such that, at the time said innerlayer is utilized in said assembly, a copper oxide coating exists on said copper surfaces in an amount, in any event no greater than about 0.20 mg/cm$^2$, which is less than that present on said copper surfaces as a result of said initially provided conversion coating of copper oxide thereon, said immersion being for a time effective to achieve said controlled dissolution and removal; and (b) substantially continuously recirculating said dissolution agent from said vessel, to and through an ion exchange resin effective to remove copper ions from said dissolution agent, and back to said vessel.

4. A method according to claim 3 wherein said ion exchange resin is effective to reduce the concentration of copper ions in said dissolution agent to less than about 0.5 g/l before return of said dissolution agent to said vessel.

* * * * *